United States Patent [19]
Agostinelli et al.

[11] Patent Number: 5,116,781
[45] Date of Patent: May 26, 1992

[54] ZINC DIFFUSION PROCESS

[75] Inventors: John A. Agostinelli; David J. Lawrence, both of Rochester, N.Y.

[73] Assignee: Eastman Kodak Company, Rochester, N.Y.

[21] Appl. No.: 568,803

[22] Filed: Aug. 17, 1990

[51] Int. Cl.⁵ ............................................. H01L 21/223
[52] U.S. Cl. ................................... 437/168; 437/167; 437/164; 437/127; 437/905; 148/DIG. 99
[58] Field of Search ............... 437/164, 167, 168, 127, 437/905; 148/DIG. 99

[56] References Cited
U.S. PATENT DOCUMENTS 3,658,584   4/1972   Schmidt ............................... 437/164
3,856,588  12/1974   Hashimoto ........................... 148/188
4,880,770  11/1989   Mir et al. ............................... 505/1

Primary Examiner—Brian E. Hearn
Assistant Examiner—Tuan Nguyen
Attorney, Agent, or Firm—Carl O. Thomas

[57] ABSTRACT

A process is disclosed of diffusing a zinc dopant into a III-V compound substrate. To avoid degrading the substrate surface the zinc dopant source is provided by coating an organic composition comprised of a zinc organic compound chosen from the group consisting of zinc alcoholates, β-diketonate chelates and carboxylate salts. The composition inludes at least one organic film-forming moiety containing from 5 to 30 carbon atoms.

11 Claims, 2 Drawing Sheets

ZINC DIFFUSION PROCESS

FIELD OF THE INVENTION

The invention relates to the fabrication of semiconductor devices. More specifically, the invention relates to a process of introducing zinc as a dopant into a III-V compound substrate.

BACKGROUND OF THE INVENTION

Hashimoto et al U.S. Pat. No. 3,856,588 discloses a process of introducing zinc as a dopant into a III-V compound substrate. A solution is prepared by dissolving a silicon acetate compound in ethanol containing a zinc compound as an impurity. The solution is spin coated on the surface of an N-type GaAs wafer and then heated at 250° C. for 15 minutes to convert the silicon acetate to silica. The silica layer is then patterned and overcoated with a second silica layer differing from the first in omitting zinc. Alternatively, a silicon nitride layer can be formed in place of the second silica layer. Upon open tube heating to 850° C. in a nitrogen atmosphere zinc is driven from the first layer into the III-V compound substrate to form a PN junction in the substrate.

The process of Hashimoto et al presents problems to those attempting a practical application of its teachings. In the course of introducing zinc as a dopant by the Hashimoto et al process the surface of the III-V compound substrate is degraded. When a polished wafer is employed as the III-V substrate, the surface of the wafer after zinc diffusion is uneven, appearing rough. A rough surface is, of course, undesirable, as it can lead to an uneven PN junction being formed in the wafer or in variations in PN junction depth from one area of the wafer to the next. Further, light emitting diodes fabricated by this process have exhibited high contact resistance when forward biased. This suggests that some type of resistive residue has been left on the surface of the substrate. Poor surface adhesion of the ohmic contact has also been observed.

A subsequent variation of the Hashimoto et al process has been to coat a silica layer lacking zinc before coating the silicon acetate layer containing zinc. Although this avoids substrate surface roughness, it creates its own disadvantage. The silica layer first put down on the substrate acts as a diffusion barrier for zinc. The means that any nonuniformity in the silica layer results in corresponding nonuniformities in the PN junction being formed, which in turn results in degraded diode performance.

Mir et al U.S. Pat. No. 4,880,770 discloses a process of preparing a superconductive thin film on a substrate. The superconductive thin film consists of rare earth alkaline earth copper oxide. The film is formed by coating each of the rare earth, alkaline earth and copper metals on the substrate in the form of metalorganic compounds, typically carboxylates. The metal carboxylates can be conveniently coated from a solution containing an organic solvent and a film-forming organic compound. Either or both of the ligands of the metalorganic compounds and the film-forming compound can contain organic moieties to promote film formation. The organic coating is heated to volatilize solvent and decompose the organic moieties remaining to form an intermediate layer. Subsequent heating to temperatures in the range of 900° to 1100° C. is employed to form a superconductive coating. While the substrate can in one form be a III-V compound wafer, it is specifically sought to avoid diffusion between the substrate and the superconductive layer as it is being formed. To this end a variety of barrier layers are suggested to avoid substrate-coating interactions.

SUMMARY OF THE INVENTION

The present invention achieves zinc diffusion into a III-V compound substrate without degrading the surface of the substrate. This translates into low ohmic contact resistances, uniform PN junctions, and high light emission efficiencies. Further, the step of first depositing a silica layer is entirely eliminated along with the attendant risk of nonuniform zinc doping.

In one aspect this invention is directed to a process of diffusing a zinc dopant into a III-V compound substrate comprising (a) coating an organic composition comprised of a zinc organic compound chosen from the group consisting of zinc alcoholates, $\beta$-diketonate chelates and carboxylate salts, the composition including at least one organic film-forming moiety containing from 5 to 30 carbon atoms, (b) thermally converting the organic composition coating to a smooth zinc oxide layer, (c) capping the zinc oxide layer, and (d) heating the zinc oxide layer to drive zinc ions into the substrate.

The drawings have been provided on an enlarged scale with relative dimensions varied for ease of viewing.

DESCRIPTION OF PREFERRED EMBODIMENTS

The term "light emitting diode" or "LED" is used in its conventional sense of indicating diodes capable of emitting electromagnetic radiation in spectral region wavelengths ranging from the ultraviolet to the infrared.

Figure 1:
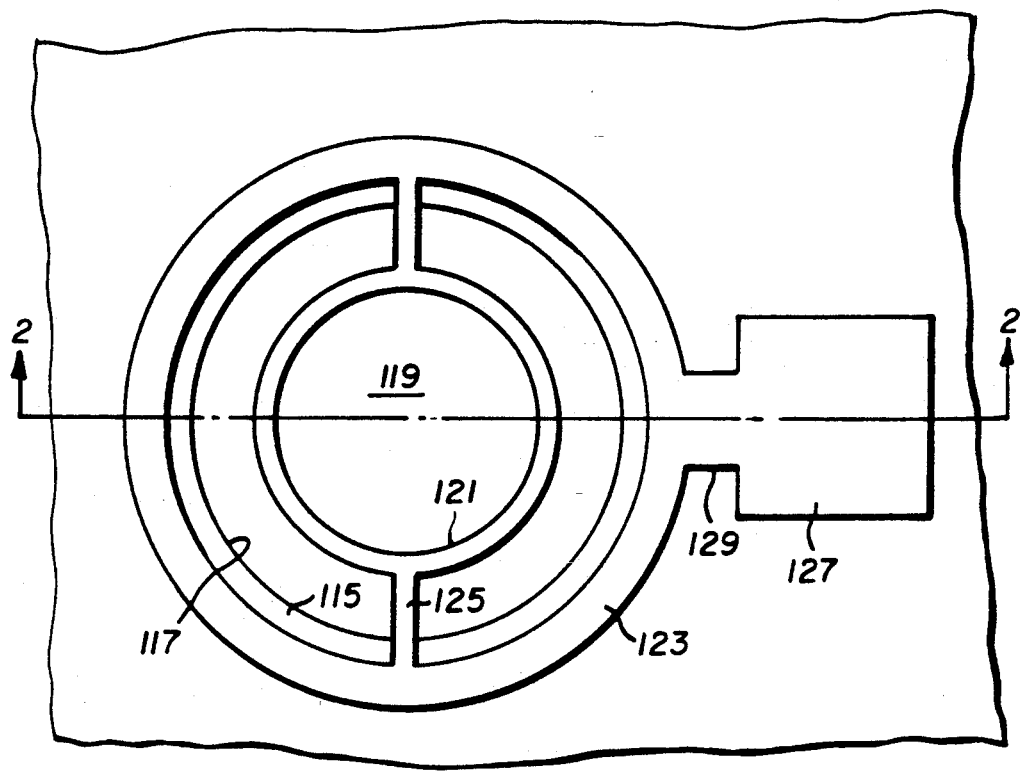
FIG. 1 is a plan view of a light emitting diode formed in a III-V compound wafer.
Figure 2:
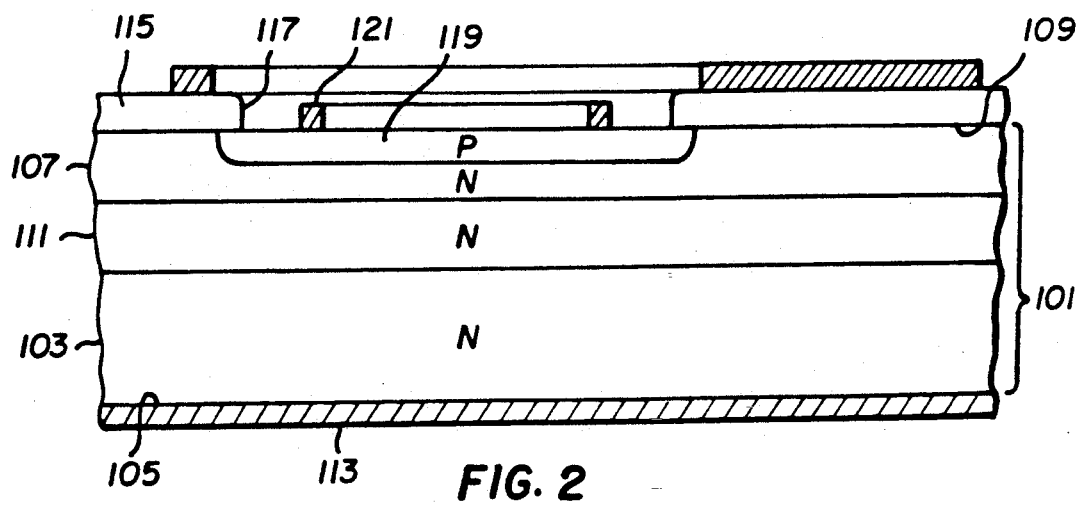
FIG. 2 is a sectional view taken along section line 2—2 in FIG. 1.

Referring to FIGS. 1 and 2, a light emitting diode (LED) is shown formed on a portion of a III-V compound wafer 101. The wafer consists of an N-type conductivity gallium arsenide zone 103 located adjacent a back side surface 105 and an N-type conductivity gallium arsenide phosphide zone 107 located adjacent a front side surface 109. The two zones are separated by an intermediate gallium arsenide phosphide zone 111 in which the phosphorus concentration increases continuously from a negligible amount adjacent the gallium arsenide zone to a level essentially equal to that of the gallium arsenide phosphide zone at the interface of the intermediate zone with the gallium arsenide phosphide zone.

In contact with the back side surface of the wafer is a metal ohmic contact 113 which acts as a cathode when the LED is forward biased. On the front side surface of the wafer is located a silicon nitride layer forming an opening 117. The wafer contains a P-type conductivity zone 119 formed by diffusion of zinc into the N-type conductivity zone 107. The P-type conductivity zone lies adjacent the front side surface and occupies the area of the wafer within the opening and extending slightly laterally beyond, reflecting lateral diffusion of the P-type zinc dopant. The zones 107 and 119 form a PN junction at their interface.

A front side ohmic contact is shown, including as an integral unit, a central circular portion 121 in contact with the P-type conductivity zone, an outer circular portion 123 overlying the silicon nitride layer and acting as a current conductor, connectors 125 joining the central and outer circular portions, and a laterally spaced lead attachment pad 127 joined to the outer circular portion through connector 129.

In operation, when the ohmic contact adjacent the front side surface is positively biased in relation to the ohmic contact adjacent the back side surface, holes migrate in P-type conductivity zone 119 to the PN junction separating zones 119 and 107. Simultaneously, electrons migrate from the back side ohmic contact 113 through N-type conductivity zones 103, 111 and 107 to the PN junction. Recombination of holes and electrons at the PN junction results in the liberation of photons that are emitted from the device through open areas in opening 117—i.e., the areas not occupied by the inner circular portion 121 and connects 125 of the front side ohmic contact.

Figure 3:
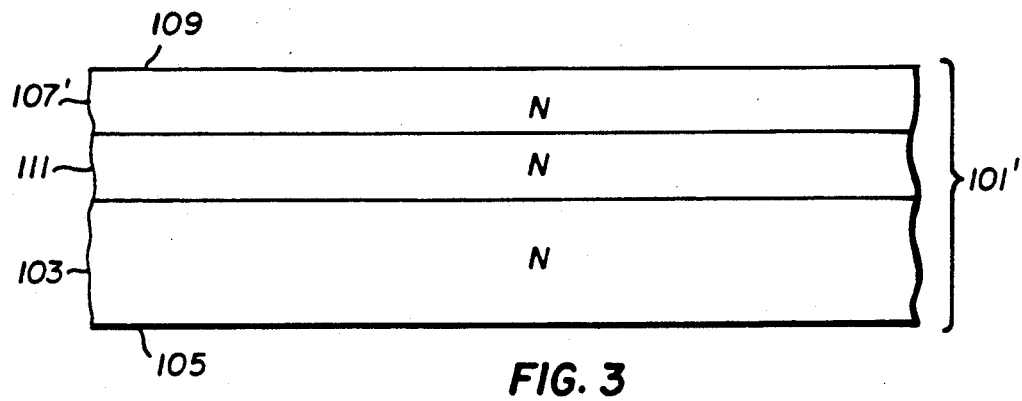
FIG. 3 is a sectional view of a portion of a III-V compound wafer.

To form an LED as shown in FIGS. 1 and 2 a III-V compound wafer 101' is employed as shown in FIG. 3. The wafer 101' is identical to wafer 101, except for lacking the P-type conductivity zone 119 of the wafer 101.

To form the P-type conductivity zone 119 in the wafer 101' a layer of silicon nitride is formed over the front surface of the wafer. By conventional photolithography and etching techniques an opening 117 is formed in the silicon nitride layer overlying the front side surface, shown as layer 115 in FIGS. 1, 2 and 4.

To transform the wafer 101' into the wafer 101 of the completed device zinc must be diffused into the wafer through the opening 117 to form the P-type conductivity zone 119. This is accomplished in four steps. First, an organic composition comprised of a zinc organic compound and chosen for its ability to form a smooth thin film is coated over the front side surface of the wafer in the area defined by the opening 117. (To simplify the coating procedure the the thin film is allowed to extend laterally over the silicon nitride layer as well.) Second, the organic composition is converted to zinc oxide by heating to intermediate temperature levels. Third, conventional capping layers, such as silica layers, are coated over the zinc oxide layer and the back side of the wafer. Fourth and last, the capped zinc oxide layer and the underlying wafer are heated to temperatures conducive to zinc migration from the zinc oxide layer into the underlying portion of the wafer not protected by the silicon nitride layer. The zinc diffusing into the wafer forms the P-type conductivity zone 119 and the PN junction at the interface of the P-type conductivity zone and the adjacent N-type conductivity zone 107.

Figure 4:
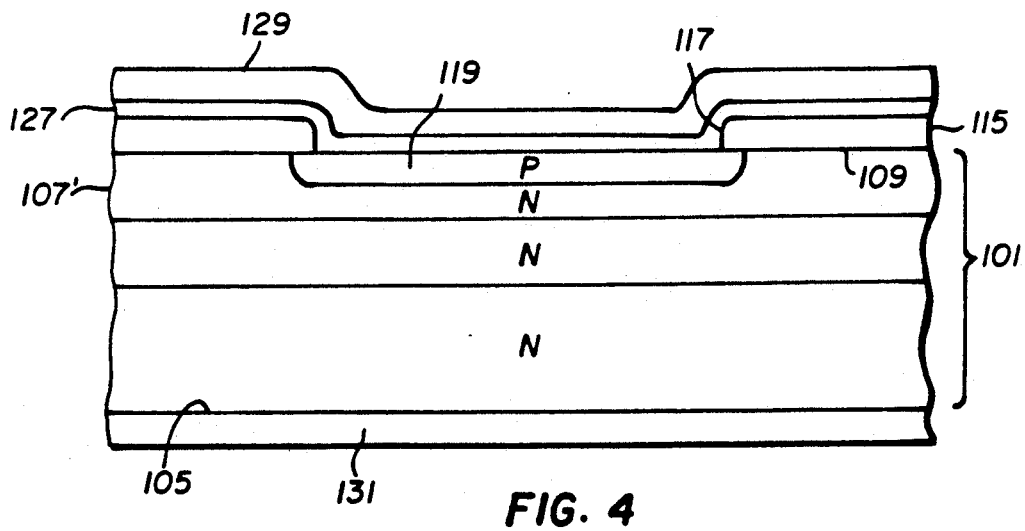
FIG. 4 is a sectional view of the III-V wafer portion at an intermediate processing stage.

FIG. 4 shows the arrangement of elements at the completion of the fourth step. The layer 127 represents the zinc oxide layer while the layers 129 and 131 represent the capping layers. Once the device has reached the stage of manufacture shown in FIG. 4 conventional procedures can thereafter be employed to remove the zinc oxide and capping layers.

The ohmic contacts can thereafter be formed by conventional techniques. The back side ohmic contact is preferably a three layer contact system consisting of a gold-germanium alloy in contact with the N-type conductivity zone 103 of the wafer, a nickel layer overlying the gold-germanium alloy layer, and a gold layer overlying the nickle layer. The ohmic contact overlying the front side surface of the wafer preferably consists essentially of aluminum.

Although fabrication is discussed above in terms of forming a single LED in a wafer, it is appreciated that it is conventional practice to form numerous laterally spaced LED's concurrently in a single wafer. After fabrication through ohmic contact formation is completed, individual LED's or groups of LED's can be separated by cleaving the wafer. The LED's can then be packaged separately or in combination with other circuit elements. It is, of course, recognized that circuit components not incompatible with the processing described above can be integrated into the wafer, if desired.

A principal advantage of the present invention lies in a procedure generally useful for uniformly diffusing zinc into III-V compound substrates without surface degradation. Although the procedure has been described above in terms of a specific LED application, the procedure has general applicability to introducing zinc as a dopant into III-V compound substrates to form varied circuit components, including as well as LED's simple diodes, PIN diodes, photodiodes, tunnel diodes, transistors (including NPN and PNP transistors, planar and nonplanar transistors, and FET transistors), thyristors, triacs and the like.

The III-V compound substrate includes at least one of aluminum, gallium and indium as a Group III component and at least one of phosphorus and arsenic as a Group V component. Specifically contemplated substrates include AlAs, GaAs, GaP, InP, InAs, $GaAs_{1-x}P_x$, $Al_yGa_{1-y}As$, $Ga_xIn_{1-x}P$, $Al_yGa_xIn_{1-(y+x)}P$, and $Ga_xIn_{1-x}P_zAs_{1-z}$, where x, y and z can range from zero to 1.0. Prior to zinc diffusion the substrate can be essentially intrinsic or exhibit P-type or N-type conductivity. The zinc doping procedure of the invention is generally applicable to conventional useful doping concentration levels.

The organic zinc containing composition used for producing the thin film of zinc oxide used as a dopant source during diffusion is formulated to facilitate formation of a thin, smooth film. While the procedure is capable of producing smooth thin films of up to 1 $\mu$m, 2 $\mu$m or even greater thicknesses, it is generally preferred to form the thinnest possible film consistent with providing sufficient zinc as a diffusion source. Film thicknesses are preferably less than 10,000 Å (1 $\mu$m), optimally less than 5000 Å (0.5 $\mu$m). Minimum film thicknesses of at least about 300 Å are preferred, optimally at least 500 Å. By producing thin, continuous organic films the maximum degree of zinc dopant uniformity is attained.

To achieve thin, uniform zinc containing organic films useful as precursors for forming the zinc oxide layer it is essential that the organic composition contain in addition to zinc at least one organic moeity containing from about 5 to 30 carbon atoms, optimally at least 6 and typically up to 20 carbon atoms. One function of the organic moiety is to reduce molecular spatial symmetries sufficiently to avoid crystallization. In other words, it is intended that the organic zinc containing coating formed on the substrate remain in an amorphous form. Simple organic moieties, such as acetates, for example, lack the structural complexity for producing uniform zinc coatings. Generally the longer and/or more highly branched the hydrocarbon chain found in the organic moiety, the more effective it is in producing uniform organic coatings.

In the simplest form of the invention a zinc compound containing at least one organic moiety satisfying the requirements noted above is dissolved in an organic solvent to form the organic film-forming composition. Any zinc compound containing at least one organic moiety containing from 5 to 30 carbons, optimally at least 6 and typically up to 20 carbon atoms, as described above, can be employed. Exemplary zinc compounds contemplated include zinc alcoholates, $\beta$-diketonate chelates and carboxylate salts. Specific exemplary zinc compounds include zinc 2-ethyhexanoates, napthenates, neodecanoates, butoxides, isopropoxides, rosinates (e.g., abietates), cyclohexanebutyrates and acetylacetonates.

Instead of relying on the zinc compound to provide the organic moiety containing the necessary number of carbons responsible for providing uniform coating properties, it is possible to provide the organic moiety in a separate film-forming compound. While any convenient organic film-forming compound can be chosen, exemplary convenient compounds include carboxylic acids, esters, alcohols and branched chain hydrocarbons. Exemplary preferred film-forming compounds include 2-ethylhexanoic acid, rosin (e.g., abietic acid), ethyl lactate, 2-ethoxyethyl acetate, and terpenes (e.g., pinene). When a separate film-forming compound containing from 5 to 30 carbon atoms is provided to insure coating uniformity, the zinc compound is still preferably an organic compound of the type noted above, but can contain fewer than 5 carbon atoms. It is, however, specifically preferred that both the organic zinc compound and a separate film-forming organic compound, if present, contain from 5 to 30 carbon atoms, preferably at least 6 carbon atoms.

When the zinc compound or the film-forming compound, if present, is a liquid, no other ingredient is required to complete the organic composition. It is, however, generally preferred to include at least one relatively low viscosity organic liquid as a solvent for the coating composition. Preferred organic liquids are nonpolar organic compounds that are readily thermally volatilized or decomposed. Specifically preferred organic solvents are organic liquids, such as liquid carboxylic acids, esters, alcohols and hydrocarbons. Exemplary preferred solvents include benzene, toluene, xylene, 2-ethylhexanoic acid, n-butyl acetate, ethyl lactate, propanol, terpenes (e.g., pinene) and mineral spirits.

The proportions of ingredients in the organic composition can be varied widely while achieving desirable uniform coatings. Since only small quantities of zinc are required for doping, zinc concentrations can range as low as about 3 percent, by weight of the organic composition. Generally thinner zinc oxide coatings are produced when the concentration of zinc in the organic composition is limited. Optimum rheological properties are generally obtained with zinc concentrations in the range of from about 5 to 20 percent by weight, based on total weight.

The organic coating can formed on the substrate by any convenient conventional means. Spin coating has been observed to be a particularly convenient approach to obtaining a uniform coating. Using this technique a small amount of the organic composition in excess of that required to cover the substrate surface is dropped on the substrate at a central location, and the substrate is thereafter spun. The centrifugal forces spread the organic composition uniformly with excess liquid being cast from the substrate. By adjustments of the viscosity of the organic composition and the rate and duration of spinning a selected thickness of the organic coating is achieved.

Once the organic coating is formed, it is heated to a temperature sufficient to drive off the organic components, either by volatilization, thermal decomposition or a combination of both. The organic solvent is typically volatilized while the organic ligands of the zinc compound and any separate film-forming agent are thermally decomposed to volatile constituents. Heating in the temperature range of from about 400° to 500° C. is generally convenient to insure complete elimination of organic compounds, leaving a uniform zinc oxide coating as a product.

Diffusion from the zinc oxide coating into the III-V compound substrate is achieved by heating to still higher temperatures than those employed for thermally decomposing the organic coating components. Zinc diffusion rates are generally known in the art, and it is contemplated to employ any conventional zinc diffusion temperature. The rate of diffusion slows with declining temperatures. A generally preferred rate of zinc diffusion is achieved at temperatures in the range of from about 600° to 700° C.

While a specific selection and sequence of forming silicon nitride and silica layers for defining the limits of the P-type conductivity zone and providing a capping layer have been described, it is appreciated that alternative selections and manipulations are possible without departing from the spirit of the invention. For example, instead of placing a silicon nitride layer with an opening on the substrate before forming the zinc containing organic coating, it is possible to form the organic coating and then pattern the coating as desired as deposited or after conversion to a zinc oxide coating. In this instance it is preferred to use silicon nitride as a uniform capping layer after the zinc oxide coating has been formed. The capping layer on the back side of the wafer can conveniently take the form of either a silica or silicon nitride layer. Other variations in the composition and sequence of forming the capping and P-type conductivity zone defining layers should be readily apparent to those skilled in the art.

EXAMPLES

The invention can be better appreciated by reference to the following specific examples.

EXAMPLE 1

An LED similar to that shown in FIGS. 1 and 2 was fabricated by the following procedure:

A wafer identical to the wafer shown in FIG. 3 was employed as a starting element. The wafer was 400 $\mu$m in overall thickness and was formed by dividing a commercially purchased wafer into squares 2.5 cm on an edge. The zone 103 was N-type conductivity gallium arsenide doped with $1 \times 10^{18}$ atoms of silicon per cc. The zone 107' was N-type conductivity GaAs$_{0.6}$P$_{0.4}$ and exhibited a thickness of 10 $\mu$m. The zone 111 was N-type conductivity gallium arsenide phosphide with a graded phosphorus content that ranged linearly from zero adjacent the zone 103 to 60 mole percent, based on arsenic and phosphorus, adjacent the zone 107'. The zones 107' and 111 were each doped with with $10^{17}$ atoms of tellurium per cc. The zone 111 was 20 μm in thickness. The front side surface 109 of the wafer, though formed by epitaxial deposition, had a smooth polished appearance.

A layer of silicon nitride was deposited over the front surface of the wafer by plasma enhanced chemical vapor deposition. Using conventional photoresist patterning and etching techniques, a portion of the silicon nitride coating was removed to provide opening 117.

A zinc oxide coating 129 was produced on the exposed front side surface of the wafer by the following technique: A solution of a zinc abietate

ligand compound was prepared by reacting 0.5 g zinc acetate with 2.0 g of rosin (Eastman 2314 TM) in 4.0 g of xylene. This was done by dissolving the rosin in the xylene and then adding the zinc acetate. The mixture was refluxed in an open vessel until all of the zinc was converted to the abietate. Xylene was added to compensate for weight loss during heating. The resulting organic composition was filtered through a 2 μm nylon mesh to remove any foreign particulate matter.

The filtered solution was next applied to the front side surface of the wafer in the area of the opening 117. The wafer was spun at 3000 rpm for 20 seconds to produce a smooth, uniform film. The coated wafer was next placed on a hot plate preheated to 500° C. After remaining on the hot plate for 5 minutes the organic composition containing zinc abietate was converted to zinc oxide by volatilizing the xylene and decomposing the zinc abietate to produce zinc oxide. A smooth, uniform film 127 of zinc oxide about 700 Å in thickness was produced.

Before driving zinc from the zinc oxide layer into the wafer to produce the P-type conductivity zone 119 it was first necessary to cap the wafer to prevent loss of dopants already present. This was accomplished by sequentially depositing silica layers 129 and 131 to a thickness of 1900 Å using a conventional chemical vapor deposition technique.

Zinc diffusion into the wafer was carried out in a tube furnace in a nitrogen atmosphere at ambient pressure. The sample was ramped from room temperature to 650° C. in 10 minutes and held at 650° C. for 103 minutes. The sample was then withdrawn from the furnace and allowed to cool in nitrogen. The silica capping layers were removed chemically using buffered HF, and the remaining ZnO material was removed with HCl.

An aluminum ohmic contact of the configuration shown in FIG. 1 was applied to the front side surface of the device and patterened. A contact system of AuGe/Ni/Au was applied to the back side surface of the wafer.

Tests of an array of light emitting diodes constructed as described above showed good output power and excellent uniformity of output within each LED and in comparing the light output of different LED's in the array.

Example 2

A Comparative Example

A second wafer identical to that of Example 1 was employed as a starting element for producing an array of LED's. A process of the type described by Hashimoto et al U.S. Pat. No. 3,856,588 was used to introduce zinc into the wafer. Emulsitone Zincsilicafilm TM solution, as used by Hashimoto et al, was employed as the zinc source. The solution was spin coated on the wafer at 3000 rpm for 15 seconds. The wafer was heated at 200° C. for 15 minutes to convert the film to zinc doped silica. The back surface of the wafer was coated with silica. The wafer was heated to 820° C. in a nitrogen atmosphere and held at this temperature for 4 hours to promote zinc diffusion. After cooling, the zinc doped silica layer was removed with buffered HF.

The front surface of the wafer from which the zinc doped silica layer was removed was covered with a rough, nonuniform residue. In attempting to form a front side contact as in Example 1 poor adhesion of the ohmic contact to the front side surface was observed. Moreover, nonuniform light output from the individual LED's and large variances of light output between LED's in the array were observed. From these observations it was concluded that the LED array of this comparative example was clearly inferior to that produced by Example 1.

The invention has been described in detail with particular reference to preferred embodiments thereof, but it will be understood that variations and modifications can be effected within the spirit and scope of the invention.

What is claimed is:

1. A process of diffusing a zinc dopant into a III-V compound substrate comprising
   coating an organic composition comprised of a zinc organic compound chosen from the group consisting of zinc alcoholates, β-diketonate chelates and carboxylate salts, said composition including at least one organic film-forming moiety containing from 5 to 30 carbon atoms,
   thermally converting the organic composition coating to a smooth zinc oxide layer,
   capping the zinc oxide layer with silica, and
   heating the zinc oxide layer to drive zinc ions into the substrate.

2. A process according to claim 1 in which the film-forming moiety is a carboxylic acid, ester, alcohol or branched chain hydrocarbon.

3. A process according to claim 1 in which the film-forming moiety is a zinc ligand.

4. A process according to claim 3 in which the ligand includes a branched hydrocarbon chain.

5. A process according to claim 1 in which the III-V substrate includes at least one of aluminum, gallium and indium as a Group III component and at least one of phosphorus and arsenic as a Group V component.

6. A process according to claim 1 in which the substrate presents a polished deposition surface, zinc is diffused into the substrate through at least a portion of the polished deposition surface, and, following zinc diffusion into the substrate, a window is opened to the polished deposition surface, and an ohmic contact is bonded to the polished deposition surface.

7. A process according to claim 1 in which the organic composition contains a voltailizable organic solvent.

8. A process according to claim 7 in which the organic solvent is chosen from among liquid carboxylic acids, esters, alcohols and hydrocarbons.

9. A process of diffusing a zinc dopant into a III-V compound substrate comprising
   coating a silicon free organic composition comprised of a zinc organic compound chosen from the group consisting of zinc alcoholates, β-diketonate chelates and carboxylate salts, said composition including at least one organic film-forming moiety containing from 5 to 30 carbon atoms, thermally converting the organic composition coating to a smooth layer consisting essentially of zinc oxide, capping the zinc oxide layer with silica, and heating the zinc oxide layer to drive zinc ions into the substrate.

10. A process of diffusing a zinc dopant into a III-V compound substrate comprising providing a monocrystalline III-V compound substrate having a smooth surface, said substrate forming a zone of N-type gallium arsenide phosphide adjacent said said smooth surface, coating on the smooth substrate surface a composition consisting essentially of (a) a volatilizable nonpolar organic solvent, (b) an organic film-forming compound containing from 6 to 30 carbon atoms chosen from the group consisting of carboxylic acids, esters, alcohols and branched chain hydrocarbons and (c) at least one dissolved zinc carboxylate salt, thermally converting the coated composition to a smooth zinc oxide layer, capping the zinc oxide layer with silica, and heating the zinc oxide layer to drive zinc ions into the substrate to form a PN junction.

11. A process according to claim 10 in which the film-forming compound contains at least one branched chain hydrocarbon moiety and contains from 8 to 20 carbon atoms.

* * * * *